(12) United States Patent
Wu

(10) Patent No.: US 12,635,077 B2
(45) Date of Patent: May 19, 2026

(54) FLEXIBLE PRINTED CIRCUIT AND ELECTRONIC DEVICE

(71) Applicant: Lenovo (Beijing) Limited, Beijing (CN)

(72) Inventor: Shuangjie Wu, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 343 days.

(21) Appl. No.: 18/453,020

(22) Filed: Aug. 21, 2023

(65) Prior Publication Data

US 2024/0114621 A1     Apr. 4, 2024

(30) Foreign Application Priority Data

Sep. 30, 2022    (CN) .......................... 202211215282.8

(51) Int. Cl.
*H05K 1/11*         (2006.01)
*H05K 1/02*         (2006.01)

(52) U.S. Cl.
CPC ............. *H05K 1/118* (2013.01); *H05K 1/028* (2013.01); *H05K 2201/10098* (2013.01)

(58) Field of Classification Search
CPC ................... H05K 1/118; H05K 1/028; H05K 2201/10098

USPC .......................................................... 174/254
See application file for complete search history.

(56) References Cited

U.S. PATENT DOCUMENTS

| | | | |
|---|---|---|---|
| 2006/0040523 A1* | 2/2006 | Renfro ................. | H01R 13/193 439/67 |
| 2013/0312999 A1* | 11/2013 | Lin ........................ | H05K 1/028 174/117 F |
| 2021/0289622 A1* | 9/2021 | Hwangbo .............. | H05K 1/025 |
| 2022/0117081 A1* | 4/2022 | Jiang ................... | H05K 1/0237 |

FOREIGN PATENT DOCUMENTS

JP          2007234500 A  *  9/2007

\* cited by examiner

*Primary Examiner* — Andargie M Aychillhum
(74) *Attorney, Agent, or Firm* — ANOVA LAW GROUP, PLLC

(57) ABSTRACT

A flexible printed circuit includes a first connection end, a second connection end, and at least one cable arranged between the first connection end and the second connection end based on a target layout. The at least one cable connects the first connection end and the second connection to transmit signals, and each include a signal line and a base structure including a first base structure corresponding to a first part of the signal line and a second base structure corresponding to a second part of the signal line. The first part and the second part are two different parts of the signal line.

11 Claims, 6 Drawing Sheets

1

FLEXIBLE PRINTED CIRCUIT AND ELECTRONIC DEVICE

CROSS-REFERENCE TO RELATED APPLICATION

This application claim priority to Chinese Patent Application No. 202211215282.8, filed on Sep. 30, 2022, the entire content of which is incorporated herein by reference.

TECHNICAL FIELD

The present disclosure relates to the technical field of electronic device and, more particularly, to a flexible printed circuit and electronic device.

BACKGROUND

In design of flexible printed circuit, impact of the structure on folding flexibility and signal transmission quality (mainly involving impedance and loss) needs to be considered. Currently, a flexible printed circuit generally has a single-structure base to support signal lines. However, when a flexible printed circuit is arranged in an electronic device, it is often needed for the flexible printed circuit to be arranged across different layout environments. In this scenario, communication stability of the flexible printed circuit with the above structure is difficult to guarantee, which affects normal use of the electronic device by a user.

SUMMARY

In accordance with the disclosure, there is provided a flexible printed circuit including a first connection end, a second connection end, and at least one cable at least one cable arranged between the first connection end and the second connection end based on a target layout. The at least one cable connects the first connection end and the second connection to transmit signals, and each include a signal line and a base structure including a first base structure corresponding to a first part of the signal line and a second base structure corresponding to a second part of the signal line. The first part and the second part are two different parts of the signal line.

Also in accordance with the disclosure, there is provided a flexible printed circuit including a first connection end, a second connection end, and at least one cable arranged between the first connection end and the second connection end based on a target layout. The at least one cable connects the first connection end and the second connection to transmit signals. A first surface of the flexible printed circuit includes a first part and a second part. The first part is different from the second part. A second surface of the flexible printed circuit includes a third part and a fourth part. The third part is different from the fourth part. The first part is same as the fourth part, and the second part is same as the third part. The first part corresponds to the third part, and the second part corresponds to the fourth part.

Also in accordance with the disclosure, there is provided an electronic device including an antenna, a communication device, and a flexible printed circuit. A first connection end of the flexible printed circuit is connected to the antenna, and a second connection end of the flexible printed circuit is connected to the communication device. A first surface of the flexible printed circuit includes a first part and a second part. The first part is different from the second part. A second surface of the flexible printed circuit includes a third part and a fourth part. The third part is different from the fourth part. The first part is same as the fourth part, and the second part is the as the third part. The first part corresponds to the third part, and the second part corresponds to the fourth part.

BRIEF DESCRIPTION OF THE DRAWINGS

In order to explain the embodiments of the present disclosure more clearly, reference is made to the accompanying drawings, which are used in the description of the embodiments. Obviously, the drawings in the following description are only some embodiments of the present disclosure, and other drawings can be obtained from these drawings without any inventive effort for those of ordinary skill in the art.

REFERENCE NUMERALS

Figure 1:
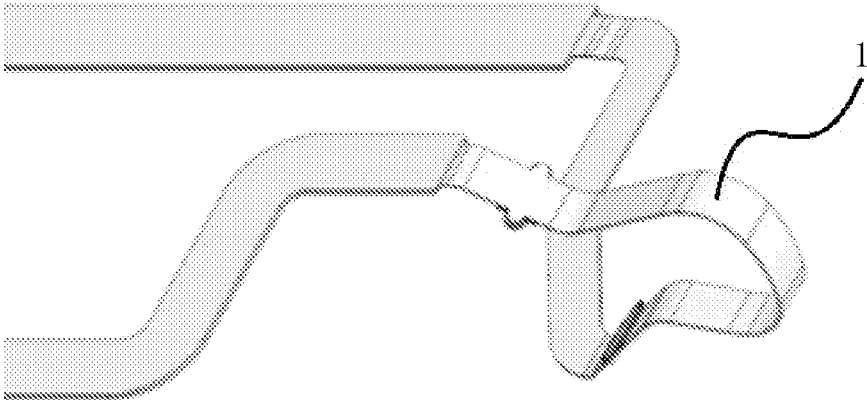
FIG. 1 is a schematic diagram of a flexible printed circuit according to an embodiment of the present disclosure.

Flexible printed circuit 1;
Signal line 2;
First dielectric layer 31;
First ground layer 32;
Second dielectric layer 41;
Second ground layer 42;
Connection member 5;
Third dielectric layer 61;
Third ground layer 62;
Fourth dielectric layer 71;
Fourth ground layer 72;
First body 81;
Second body 82;
Shaft assembly 83;
First area A;
Second area B;
Third area C;
Fourth area D;
Fifth area E.

DETAILED DESCRIPTION OF THE EMBODIMENTS

The present disclosure provides a flexible printed circuit and an electronic device. The flexible printed circuit is conducive to ensuring that communication stability of the flexible printed circuit is not affected as much as possible in a complex layout environment, which guarantees normal use of the electronic device by a user.

The technical solutions in the embodiments of the present disclosure will be described in detail with reference to the accompanying drawings. Obviously, the described embodiments are only some of rather than all the embodiments of the present disclosure. Based on the described embodiments, all other embodiments obtained by those of ordinary skill in the art without inventive effort shall fall within the scope of the present disclosure.

Referring to FIGS. 1-6, the present disclosure provides a flexible printed circuit 1, which includes a first connection end, a second connection end, and N cables arranged between the first connection end and the second connection end based on a target layout. N is a positive integer. The target layout can be N cables arranged in a single layer, or N cables arranged in more than two layers. When there are more than two cables on the same layer, the cables are arranged side by side. The cables connect the first connection end and the second connection end of the flexible printed circuit 1 to transmit signals, which realizes a communication function of the flexible printed circuit 1. Each cable includes a signal line 2 and a base structure, and as a part of the cable, the base structure can provide support for the signal line 2, i.e., the signal line 2 is arranged at the base structure. The base structure at least includes a first base structure corresponding to a first part of the signal line 2 and a second base structure corresponding to a second part of the signal line 2. The first part and the second part are two different parts of the signal line 2, which refers to that the first part and the second part are located at two different positions in an extension direction (i.e., an axial direction) of the signal line 2. The first part and the second part may be at two adjacent positions, or at two positions separated by a certain distance. The first part and the second part of the signal line 2 are arranged at different base structures. The first part is arranged at the first base structure, and the second part is arranged at the second base structure. The first base structure and the second base structure are different, which refers to that there is a position change between the two at least in a circumferential direction of the signal line 2. The position change may include a situation in which a separation angle between the first base structure and the second base structure in the circumferential direction of the signal line 2 is relatively small, or may include a situation in which the separation angle between the first base structure and the second base structure in the circumferential direction of the signal line 2 is relatively large. When the separation angle is relatively small, projections of the first base structure and the second base structure in the axial direction of the signal line 2 overlap; when the separation angle is relatively large, the projections of the first base structure and the second base structure in the axial direction of the signal line 2 do not overlap. That is, a relative position relationship between the first part of the signal line 2 and the first base structure is different from a relative position relationship between the second part of the signal line 2 and the second base structure. Therefore, in the flexible printed circuit 1 provided by the present disclosure, the cables do not have a single matrix structure to support various parts of the signal line 2 throughout an entire length, so that the various parts of the signal line 2 can be provided with corresponding base structures according to needs of layout environment, which ensures the flexible printed circuit 1 to have good and stable communication quality when it is arranged across different environments, i.e., a communication stability of the signal line 2 is guaranteed.

Figure 2:
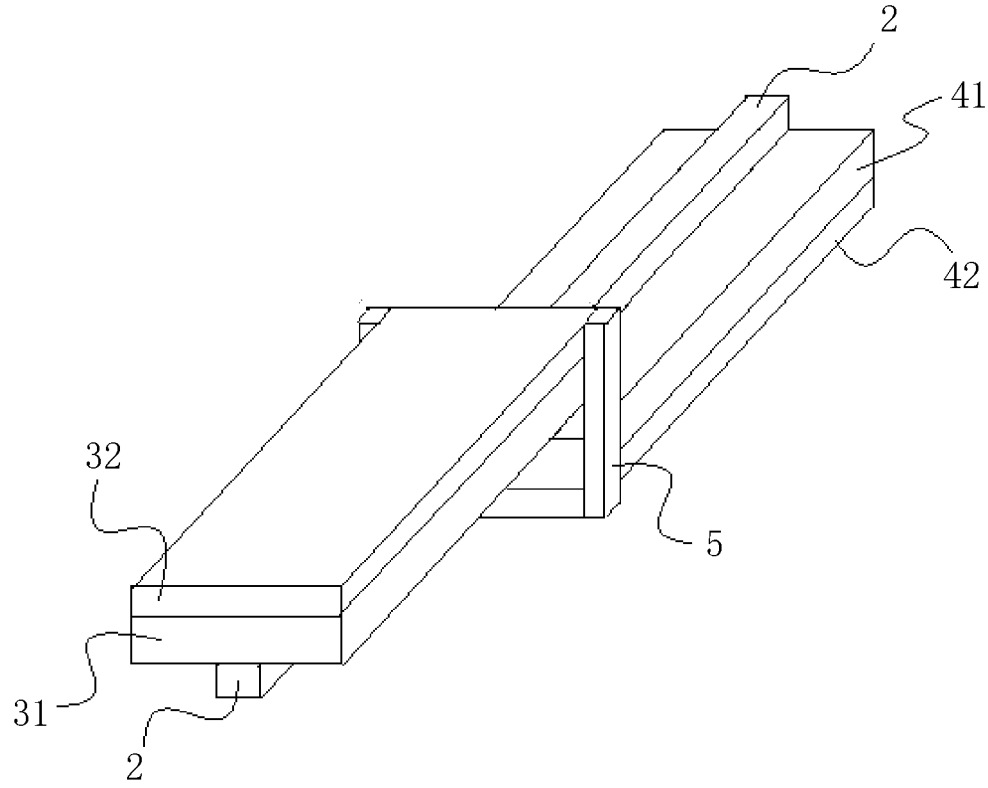
FIG. 2 is a three-dimensional schematic diagram of a cable structure of a flexible printed circuit according to an embodiment of the present disclosure.
Figure 3:
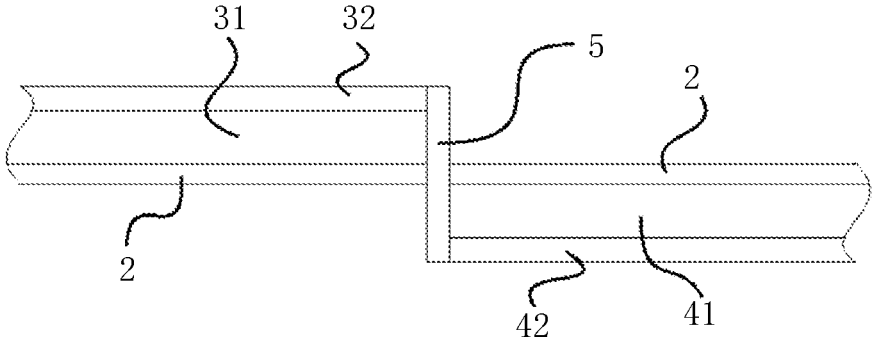
FIG. 3 is a side view of the cable structure shown in FIG. 2.

As shown in FIGS. 2 and 3, in some embodiments, the first part and the second part of the signal line 2 are two adjacent parts in the extension direction (i.e., the axial direction) of the signal line 2. The first base structure corresponding to the first part includes a first dielectric layer 31 and a first ground layer 32 that are stacked, and the first dielectric layer 31 is in contact with the signal line 2. The second base structure corresponding to the second part includes a second dielectric layer 41 and a second ground layer 42 that are stacked, and the second dielectric layer 41 is in contact with the signal line 2. The separation angle between the first base structure and the second base structure in the circumferential direction of the signal line 2 is 180°. As shown in FIG. 3, the first ground layer 32 is located below the signal line 2, and the second ground layer 42 is located above the signal line 2. The cable with this structure can be applied to a situation in which a lower surface of the cable corresponding to the first part of the signal line 2 is likely to be in contact with foreign objects (such as metal parts of other components in the layout environment), while an upper surface of the cable corresponding to the second part of the signal line 2 is likely to be in contact with the foreign objects. For example, the flexible printed circuit 1 is arranged at a foldable part of the electronic device. When the foldable part is bent, left side of the signal line 2 is tilted clockwise relative to right side in FIG. 3, and the first ground layer 32 is in contact with the metal part of the electronic device when the signal line 2 is bent, which prevents the first part of the signal line 2 from being in contact with the metal part, and reduces an impact of the metal part on the communication stability of the signal line 2.

In some other embodiments, a relative position relationship between the first base structure and the second base structure may also be arranged in other forms as needed. As shown in FIG. 2, the separation angle between the first base structure and the second base structure in the circumferential direction of the signal line 2 may be changed from the current 180° to other angle values. For example, the separation angle between the first base structure and the second base structure in the circumferential direction of the signal line 2 is 90°, so that the first ground layer 32 is located above the signal line 2, and the second ground layer 42 is located at left or right of the signal line 2. As another example, the angle value may also be another value such as 10°, 30°, 45°, 60°, etc. In addition, the first base structure and the second base structure may also be changed from being adjacent to each other to being separated by a preset distance in the axial direction of the signal line 2. The preset distance causes the first part and the second part of the signal line 2 to not be adjacent.

There are many types of the cable. In some embodiments, the cable is a microstrip line, which has excellent performance in terms of bending life. According to the cable structure described above, a microstrip line structure provided by the present disclosure is different from a conventional microstrip line. In the conventional microstrip line, reference ground layers are located at the same side of a conductor strip at various positions of the conductor strip. In the microstrip line provided by the present disclosure, there are at least two positions of the conductor strip to satisfy that a relative position relationship between the reference ground layer corresponding to one position and the conductor strip is different from a relative position relationship between the reference ground layer corresponding to the other position and the conductor strip. In some other embodiments, the cable provided by the present disclosure can also be of other types. For example, the cable can be a stripline, where the reference ground layers are arranged at upper and lower sides of the conductor strip in a first part of the conductor strip, and the reference ground layers are arranged at left and right sides of the conductor strip in a second part of the conductor strip.

In addition, in the flexible printed circuit 1 provided by the present disclosure, a cross-sectional shape of the signal line 2 can be in various forms. For example, the cross-sectional shape of the signal line 2 can be rectangular or circular. A cross-sectional shape of a ground layer in the base structure can also be in various forms. For example, the cross-sectional shape of the ground layer can be circular, rectangular, or fan-shaped. In some embodiments, the ground layer in the base structure is a ground wire, which can simplify the cable structure. In some other embodiments, the ground layer can also be configured to be connected to the ground wire through a conductor.

As shown in FIG. 2, the base structure in the present disclosure may also include a connection member 5 connecting the first base structure and the second base structure. That is, the connection member 5 forms a physical connection between the first base structure and the second base structure, so as to achieve proper cable strength at a transition between the first base structure and the second base structure. In some embodiments, the connection member 5 connects the first ground layer 32 of the first base structure and the second ground layer 42 of the second base structure as a conductor, so that the first ground layer 32 and the second ground layer 42 do not need to lead out wires to be connected to the ground wire, which facilitates a flexible arrangement of the ground wire at a suitable position of the flexible printed circuit 1.

Figure 4:
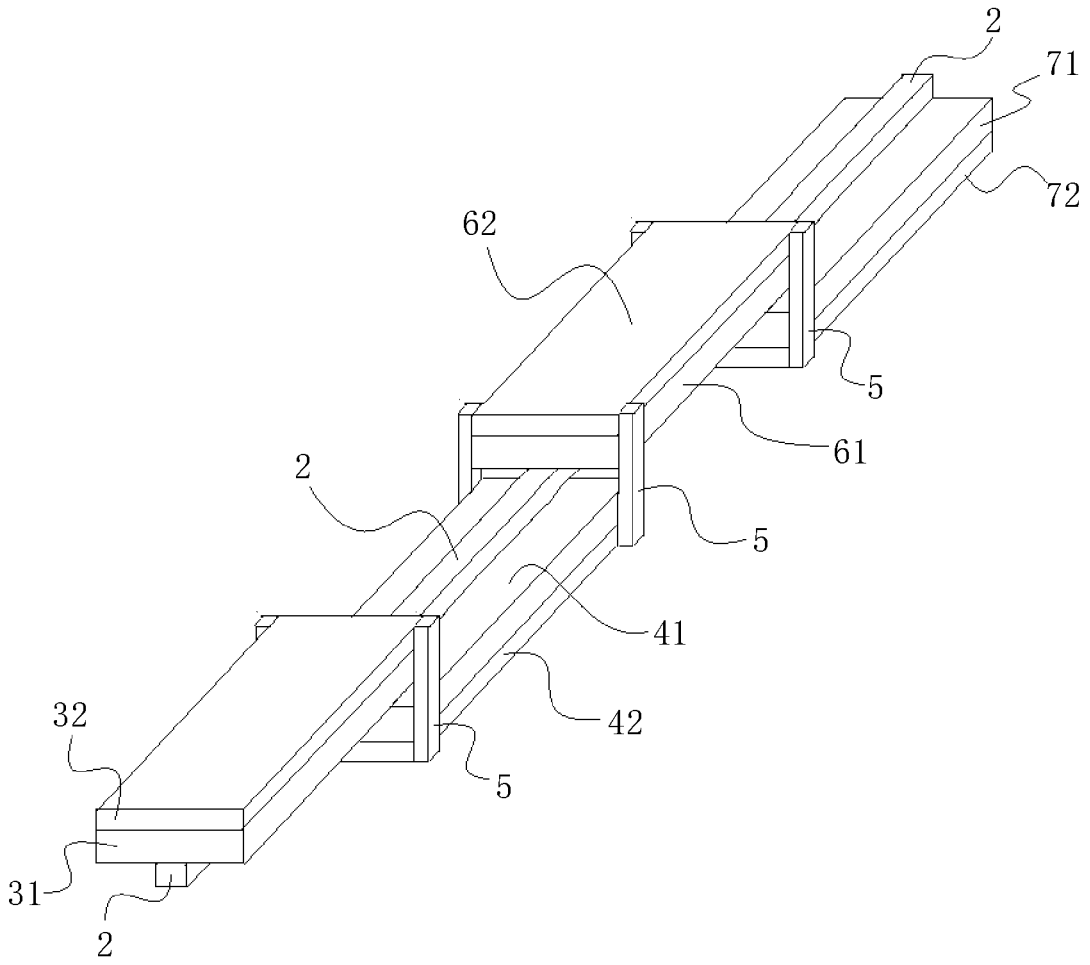
FIG. 4 is a three-dimensional schematic diagram of a cable structure of a flexible printed circuit according to another embodiment of the present disclosure.

The base structure of the cable may change in position relative to the signal line 2 at multiple positions in the present disclosure. As shown in FIG. 4, in some embodiments, the base structure changes in position relative to the signal line 2 at three positions, so the base structure includes the first base structure, the second base structure, a third base structure, and a fourth base structure. The first base structure includes the first dielectric layer 31 and the first ground layer 32 that are stacked, and the first dielectric layer 31 is in contact with the signal line 2. The second base structure includes the second dielectric layer 41 and the second ground layer 42 that are stacked, and the second dielectric layer 41 is in contact with the signal line 2. The third base structure includes a third dielectric layer 61 and a third ground layer 62 that are stacked, and the third dielectric layer 61 is in contact with the signal line 2. The fourth base structure includes a fourth dielectric layer 71 and a fourth ground layer 72 that are stacked, and the fourth dielectric layer 71 is in contact with the signal line 2. That is, from a first end to a second end of the signal line 2, ground layers of the base structure are alternately arranged at a first side and a second side of the signal line 2 opposite to each other. As shown in FIG. 4, the first ground layer 32, the second ground layer 42, the third ground layer 62, and the fourth ground layer 72 are sequentially arranged in the axial direction (or longitudinal direction) of the signal line 2. However, the first ground layer 32 and the third ground layer 62 are arranged at an upper side of the signal line 2, while the second ground layer 42 and the fourth ground layer 72 are arranged at a lower side of the signal line 2. In some embodiments, thicknesses of the first dielectric layer 31, the second dielectric layer 41, the third dielectric layer 61, and the fourth dielectric layer 71 are equal. In some other embodiments, thicknesses of dielectric layers corresponding to different parts of the signal line 2 may also be unequal. Similarly, thicknesses of the ground layers corresponding to different parts of the signal line 2 may be equal or unequal.

In some embodiments, in order to reduce thickness of the flexible printed circuit 1 and improve flexibility of the flexible printed circuit 1, a surface of the cable can be flush with a surface of the flexible printed circuit 1, i.e., the surface of the cable is a component of the surface of the flexible printed circuit 1. In this structure, a first surface of the flexible printed circuit 1 includes at least one first part and at least one second part, and the first part is different from the second part. A second surface of the flexible printed circuit 1 includes at least one third part and at least one fourth part, and the third part is different from the fourth part. The first part is the same as the fourth part, and the second part is the same as the third part. The first part corresponds to the third part, and the second part corresponds to the fourth part. That is, the flexible printed circuit 1 includes the first surface and the second surface opposite to each other, where the first part of the first surface is opposite to the third part of the second surface, and the second part of the first surface is opposite to the fourth part of the second surface. The first part is different from the second part, which refers to that the first surface has different surface structures in the two parts. Similarly, the third part is different from the fourth part, which refers to that the second surface has different surface structures in the two parts. The first part is the same as the fourth part, which refers to that the first surface and the second surface have the same surface structure in the two parts. The second part is the same as the third part, which refers to that that the first surface and the second surface have the same surface structure in the two parts. For example, the first part and the fourth part are different parts of the ground layers of the flexible printed circuit 1, i.e., the first surface and the second surface are both provided with the ground layers, and within a cross-section of a position where the flexible printed circuit 1 is provided with the ground layers, the ground layers are located only at one of the first surface and the second surface. In this structure of the flexible printed circuit 1, the ground layers of the flexible printed circuit 1 are dispersedly arranged at the first surface and the second surface, so that both the first surface and the second surface have a part that can be protected by the ground layers. When the part protected by the ground layers is in contact with foreign objects, since the ground layers are in contact with the foreign objects, contact between the signal line 2 and the foreign objects can be avoided, which reduces an impact of the foreign objects on signals transmitted by the flexible printed circuit 1.

The present disclosure also provides an electronic device, which includes an antenna, a communication device, and the flexible printed circuit 1. The first connection end of the flexible printed circuit 1 is connected to the antenna, and the second connection end of the flexible printed circuit 1 is connected to the communication device. The first surface of the flexible printed circuit 1 includes the first part and the second part, and the first part is different from the second part. The second surface of the flexible printed circuit 1 includes the third part and the fourth part, and the third part is different from the fourth part. The first part is the same as the fourth part, and the second part is the same as the third part. The first part corresponds to the third part, and the second part corresponds to the fourth part. That is, the flexible printed circuit 1 used in the electronic device has the first surface and the second surface opposite to each other, and the ground layers are dispersedly arranged at the first surface and the second surface. In the structure of the electronic device, the first surface and the second surface of the flexible printed circuit 1 refer to two opposite surfaces after the flexible printed circuit 1 is installed in the electronic device, i.e., two opposite surfaces after the flexible printed circuit 1 is connected to the antenna and the communication device. Therefore, the first part and the second part of the first surface may belong to the same surface of the flexible printed circuit 1 when the flexible printed circuit 1 is made, and the first part and the second part are located at the first surface after the flexible printed circuit 1 is installed in the electronic device. The first part and the second part of the first surface may also belong to different surfaces of the flexible printed circuit 1 when the flexible printed circuit 1 is made, but both the first part and the second part are located at the first surface through an operation performed when the flexible printed circuit 1 is installed in the electronic device. For example, both the first part and the second part belong to an upper surface of the flexible printed circuit 1 when the flexible printed circuit 1 is made, and when the flexible printed circuit 1 is installed at the electronic device, the flexible printed circuit 1 is only flattened and/or bent without twist, then the upper surface of the flexible printed circuit 1 is the first surface. As another example, the first part belongs to the upper surface of the flexible printed circuit 1 when the flexible printed circuit 1 is made, while the second part belongs to a lower surface of the flexible printed circuit 1 when the flexible printed circuit 1 is made, but when the flexible printed circuit 1 is installed at the electronic device, the flexible printed circuit 1 is twisted, so that positions of the second part and a part of the upper surface originally corresponding to the second part are reversed, then the second part is moved to an upper side of the flexible printed circuit 1, and the upper side of the twisted flexible printed circuit 1 is the first surface.

The electronic device may have a first form and a second form in the present disclosure. For example, the electronic device is a foldable device, which may be a mobile phone, a tablet computer, a notebook computer, or another type of device. In the electronic device described above, at least one first target object in the first part and the fourth part is located at a first bending position of the flexible printed circuit 1 in the first form, and the first target object is configured to reduce an impact of the metal part of the electronic device on the signals transmitted by the flexible printed circuit 1. At least one second target object in the first part and the fourth part is located at a second bending position of the flexible printed circuit 1 in the second form, and the second target object is configured to reduce the impact of the metal part of the electronic device on the signals transmitted by the flexible printed circuit 1. That is, in some embodiments, there is a part in the first part and/or the fourth part arranged at the flexible printed circuit 1 that may be in contact with the metal part of the electronic device due to a change of the form of the electronic device, and the part forms a bend when the electronic device changes form and is then in contact with the metal part of the electronic device. Also, the first part and/or the fourth part arranged at the part plays a role in reducing the impact of the metal part of the electronic device on the signals transmitted by the flexible printed circuit 1. For example, the first part and the fourth part may be different parts of the ground layer of the flexible printed circuit 1, and contact between the ground layer and the metal part of the electronic device avoids contact between the signal line 2 corresponding to the ground layer and the metal part of the electronic device, which reduces the impact of the metal part of the electronic device on the signals transmitted by the flexible printed circuit 1.

Figure 5:
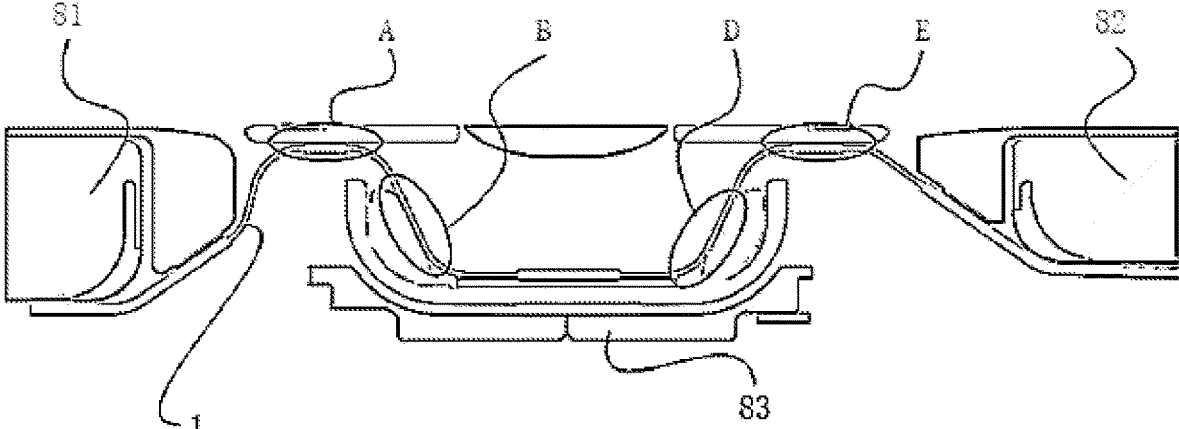
FIG. 5 is a schematic diagram showing a position of a rotation shaft when an electronic device is in an unfolded state according to an embodiment of the present disclosure.
Figure 6:
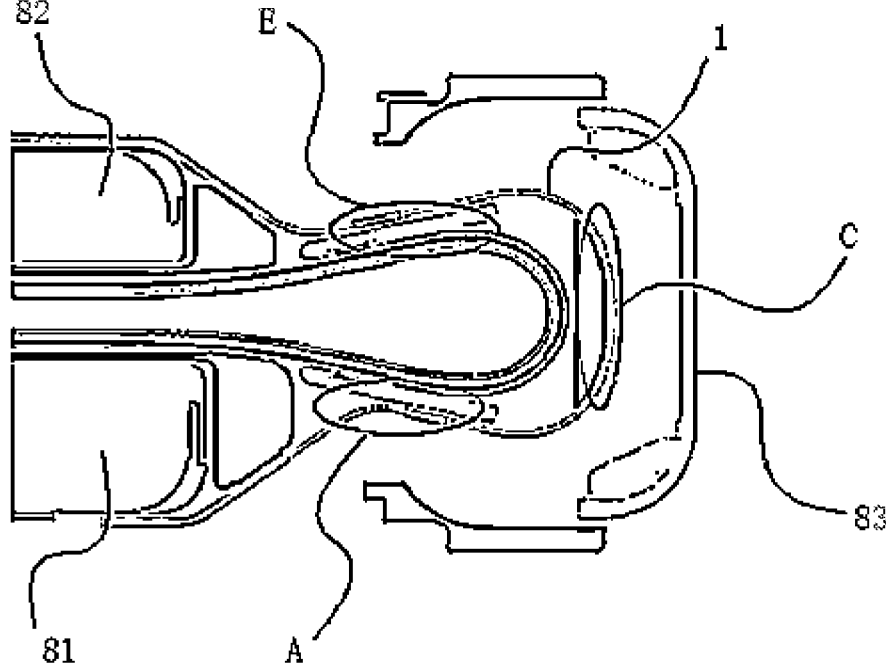
FIG. 6 is a schematic diagram showing a position of a rotation shaft when an electronic device is in a folded state according to an embodiment of the present disclosure.

As shown in FIGS. 5 and 6, in some embodiments, a first body 81 and a second body 82 of the electronic device are connected through a shaft assembly 83, and the flexible printed circuit 1 is arranged passing through the shaft assembly 83, i.e., the first connection end of the flexible printed circuit 1 is connected to the first body 81, and the second connection end of the flexible printed circuit 1 is connected to the second body 82. The flexible printed circuit 1 includes a first area A, a second area B, a third area C, a fourth area D, and a fifth area E that are sequentially distributed from the first body 81 to the second body 82. When the electronic device is in an unfolded state, the flexible printed circuit 1 is in the first form. That is, as shown in FIG. 5, the first body 81 and the second body 82 are unfolded to each other, and contact between the flexible printed circuit 1 and the metal part of the electronic device includes inner contact and outer contact. The inner contact refers to that the upper side of the flexible printed circuit 1 in FIG. 5 is in contact with the metal part of the electronic device, and the outer contact refers to that a lower side of the flexible printed circuit 1 in FIG. 5 is in contact with the metal part of the electronic device. As shown in FIG. 5, the first area A and the fifth area E have inner contact, the second area B and the fourth area D have outer contact, and the third area C has no contact. When the electronic device is in the unfolded state, the contact between the flexible printed circuit 1 and the metal part of the electronic device includes both the inner contact and the outer contact, so the first target object includes a target object that belongs to the first part and a target object that belongs to the fourth part, i.e., the first target object includes both a target object located at the first surface of the flexible printed circuit 1 and a target object located at the second surface of the flexible printed circuit 1. That is, both the first surface and the second surface of the flexible printed circuit 1 have target objects in contact with the metal part of the electronic device when the electronic device is in the unfolded state, which reduces the impact of the metal part of the electronic device on the signals transmitted by the flexible printed circuit 1.

When the electronic device is in a folded state, the flexible printed circuit 1 is in the second form. That is, as shown in FIG. 6, the first body 81 and the second body 82 are folded together, and the contact between the flexible printed circuit 1 and the metal part of the electronic device only includes the inner contact without outer contact. As shown in FIG. 6, the first area A, the third area C, and the fifth area E have inner contact, and the second area B and fourth area D have no contact. When the electronic device is in the folded state, the contact between the flexible printed circuit 1 and the metal part of the electronic device only includes the inner contact, so the second target object includes the target object that belongs to the first part, i.e., the second target object does not include the target object located at the second surface of the flexible printed circuit 1. That is, only the first surface out of the first surface and the second surface of the flexible printed circuit 1 has the target object in contact with the metal part of the electronic device when the electronic device is in the folded state, which reduces the impact of the metal part of the electronic device on the signals transmitted by the flexible printed circuit 1.

In this specification, structures of various parts are described in a progressive manner, and the description of the structures of the various parts is focused on difference from an existing structure. An overall and partial structure of the flexible printed circuit and the electronic device can be obtained by combining the structures of the various parts.

The foregoing description of the disclosed embodiments enables those skilled in the art to implement or use the present disclosure. Various modifications to these embodiments will be obvious to those skilled in the art, and the general principles defined herein can be implemented in other embodiments without departing from the spirit or scope of the present disclosure. Therefore, the present disclosure is not limited to the embodiments shown herein, but should conform to the widest scope consistent with the principles and novel features disclosed herein.

What is claimed is:

1. A flexible printed circuit comprising:
a first connection end;
a second connection end; and
at least one cable arranged between the first connection end and the second connection end based on a target layout, and connecting the first connection end and the second connection to transmit signals, each of the at least one cable including:
a signal line; and
a base structure including a first base structure corresponding to a first part of the signal line and a second base structure corresponding to a second part of the signal line, the first part and the second part being two different parts of the signal line, and a separation angle being formed between the first base structure and the second base structure in a circumferential direction of the signal line.

2. The flexible printed circuit of claim 1, wherein each of the at least one cable includes a microstrip line.

3. The flexible printed circuit of claim 1, wherein the base structure includes:
a dielectric layer in contact with the signal line; and
a ground layer, the dielectric layer and the ground layer being stacked.

4. The flexible printed circuit of claim 3, wherein the ground layer includes a ground wire.

5. The flexible printed circuit of claim 1, wherein the base structure further includes a connection member connecting the first base structure and the second base structure.

6. A flexible printed circuit comprising:
a first connection end;
a second connection end; and
at least one cable arranged between the first connection end and the second connection end based on a target layout, and connecting the first connection end and the second connection to transmit signals;
wherein:
a first surface of the flexible printed circuit includes a first part and a second part, the first part being different from the second part;
a second surface of the flexible printed circuit includes a third part and a fourth part, the third part being different from the fourth part;
the first part is same as the fourth part, and the second part is same as the third part; and
the first part corresponds to the third part, and the second part corresponds to the fourth part.

7. The flexible printed circuit of claim 6, wherein the first part and the fourth part are different parts of a ground layer of the flexible printed circuit.

8. An electronic device comprising:
an antenna;
a communication device; and
a flexible printed circuit;
wherein:
a first connection end of the flexible printed circuit is connected to the antenna, and a second connection end of the flexible printed circuit is connected to the communication device;
a first surface of the flexible printed circuit includes a first part and a second part, the first part being different from the second part;
a second surface of the flexible printed circuit includes a third part and a fourth part, the third part being different from the fourth part;
the first part is same as the fourth part, and the second part is the as the third part; and
the first part corresponds to the third part, and the second part corresponds to the fourth part.

9. The electronic device of claim 8, wherein:
at least one first target object in the first part and the fourth part is located at a first bending position of the flexible printed circuit in a first form, the at least one first target object being configured to reduce an impact of a metal part of the electronic device on the signals transmitted by the flexible printed circuit; and
at least one second target object in the first part and the fourth part is located at a second bending position of the flexible printed circuit in a second form, the at least one second target object being configured to reduce the impact of the metal part of the electronic device on the signals transmitted by the flexible printed circuit.

10. The electronic device of claim 9, wherein:
when the electronic device is in an unfolded state, the flexible printed circuit is in the first form, and the at least one first target object includes a target object that belongs to the first part and a target object that belongs to the fourth part; and
when the electronic device is in a folded state, the flexible printed circuit is in the second form, and the at least one second target object includes a target object that belongs to the first part.

11. The flexible printed circuit according to claim 1, wherein the first base structure is arranged at a first side of the signal line and the second base structure is arranged at a second side of the signal line that is opposite to the first side.

* * * * *